United States Patent
Hwang

(10) Patent No.: US 10,130,002 B2
(45) Date of Patent: Nov. 13, 2018

(54) HEAT RADIATION ADHESIVE, HEAT RADIATION SHEET USING SAME, AND ELECTRONIC DEVICE HAVING SAME

(71) Applicant: AMOGREENTECH CO., LTD., Gimpo-si (KR)

(72) Inventor: Seung Jae Hwang, Incheon (KR)

(73) Assignee: AMOGREENTECH CO., LTD., Gimpo-si (KR)

( * ) Notice: Subject to any disclaimer, the term of this patent is extended or adjusted under 35 U.S.C. 154(b) by 0 days.

(21) Appl. No.: 15/319,160

(22) PCT Filed: Jun. 25, 2015

(86) PCT No.: PCT/KR2015/006505
§ 371 (c)(1),
(2) Date: Dec. 15, 2016

(87) PCT Pub. No.: WO2015/199467
PCT Pub. Date: Dec. 30, 2015

(65) Prior Publication Data
US 2017/0137674 A1    May 18, 2017

(30) Foreign Application Priority Data
Jun. 26, 2014    (KR) ........................ 10-2014-0078739

(51) Int. Cl.
| H05K 7/20 | (2006.01) |
| C09J 11/04 | (2006.01) |
| C09J 9/00 | (2006.01) |
| B32B 7/12 | (2006.01) |
| B32B 27/08 | (2006.01) |

(Continued)

(52) U.S. Cl.
CPC ................ H05K 7/20 (2013.01); B32B 7/12 (2013.01); B32B 27/08 (2013.01); B32B 27/20 (2013.01);
(Continued)

(58) Field of Classification Search
None
See application file for complete search history.

(56) References Cited

U.S. PATENT DOCUMENTS

| H1699 H | * | 12/1997 | Vavrick | ................. B29C 65/344 156/276 |
| 2009/0059489 A1 | * | 3/2009 | Yoo | ....................... H05K 9/0096 361/679.21 |

(Continued)

FOREIGN PATENT DOCUMENTS

| CN | 1545121 A | * | 11/2004 |
| JP | 03200397 A | * | 9/1991 |

(Continued)

OTHER PUBLICATIONS

International Search Report—PCT/KR2015/006505 dated Aug. 24, 2015.

*Primary Examiner* — Dimary Lopez Cruz
*Assistant Examiner* — Zhengfu Feng
(74) *Attorney, Agent, or Firm* — Cantor Colburn LLP

(57) ABSTRACT

Provided are a heat-radiating adhesive member, a heat-radiating sheet using the heat-radiating adhesive member, and an electronic apparatus having the heat-radiating sheet. The heat-radiating adhesive member includes: an adhesive layer; first thermally conductive fillers that are dispersed inside the adhesive layer and spreads heat generated from a heat-generating component of an electronic apparatus in a horizontal direction of the adhesive layer; and second thermally conductive fillers that are dispersed inside the adhesive layer and transfer the heat generated from the heat-generating component of the electronic apparatus to the first thermally conductive fillers.

9 Claims, 3 Drawing Sheets

(51) Int. Cl.
*B32B 27/20* (2006.01)
*C09J 7/00* (2018.01)
*H05K 1/02* (2006.01)
*H05K 1/18* (2006.01)
*C09J 7/20* (2018.01)
*C08K 7/04* (2006.01)
*C08K 7/18* (2006.01)

(52) U.S. Cl.
CPC . *C09J 7/00* (2013.01); *C09J 7/20* (2018.01); *C09J 9/00* (2013.01); *C09J 11/04* (2013.01); *H05K 1/0203* (2013.01); *H05K 1/028* (2013.01); *H05K 1/18* (2013.01); *B32B 2307/302* (2013.01); *B32B 2457/08* (2013.01); *C08K 7/04* (2013.01); *C08K 7/18* (2013.01); *C09J 2203/326* (2013.01); *C09J 2205/102* (2013.01); *H05K 2201/06* (2013.01); *H05K 2201/10128* (2013.01); *H05K 2201/10159* (2013.01)

(56) References Cited

U.S. PATENT DOCUMENTS

2010/0200801 A1* 8/2010 Ramasamy .............. C08K 3/38
252/74
2012/0194982 A1* 8/2012 Hishida ................. B29C 70/222
361/679.01

FOREIGN PATENT DOCUMENTS

| JP | 2002121393 A | * | 4/2002 |
| JP | 2006137833 | | 6/2006 |
| JP | 2006137833 A | * | 6/2006 |
| KR | 1020060027210 | | 3/2006 |
| KR | 20120073792 | | 7/2012 |
| KR | 20120125365 | | 11/2012 |
| KR | 101238013 | | 2/2013 |
| KR | 20140019735 | | 2/2014 |
| KR | 20140019737 | | 2/2014 |
| KR | 20140029159 | | 3/2014 |

* cited by examiner

HEAT RADIATION ADHESIVE, HEAT RADIATION SHEET USING SAME, AND ELECTRONIC DEVICE HAVING SAME

TECHNICAL FIELD

The present invention relates to a heat-radiating adhesive member, and more particularly, to a heat-radiating adhesive member capable of efficiently radiating heat generated from a heat-generating component of an electronic apparatus, a heat-radiating sheet using the heat-radiating adhesive member, and an electronic apparatus having the heat-radiating sheet.

BACKGROUND ART

Recently, according to technologies that are being developed so rapidly, high-performance, light-weight, thin, short, and small electronic apparatuses have been appearing and commercialized in the market.

If such electronic apparatuses do not radiate heat generated in the inside thereof, over-accumulation of heat may cause generation of an afterimage on a screen, disorders of a system, a reduced life span of a product, and the like, and may provide a source of explosion and fire in severe cases.

In particular, mobile terminals such as cellular phones (smartphones) are required to have a small-size and a light-weight, in order to maximize user's portability and convenience, and integrated components are being gradually mounted in a small space to meet high-performance. Accordingly, components used in mobile terminals may heighten a heat-generating temperature to obtain high-performance, and the heightened heat-generating temperature may have an effect on adjacent components to thus degrade performance of the mobile terminals.

Meanwhile, mobile terminals such as mobile phones are mostly used in a state in contact with a user's face, and thus heat generated in the mobile terminals is delivered to the user's skin to cause a problem of resulting in a low-temperature burn which may damage the protein in the user's skin. As a result, it is necessary to reduce the heat transferred out of the mobile terminals at a predetermined temperature or lower.

A variety of materials have been employed to solve the problem caused by heat generation of the mobile terminals, but an optimal material whose thickness is thin and having excellent heat-radiating performance has yet to be developed. Thus, the research and technology development thereof is urgent.

Meanwhile, Korean Patent Application Publication No. 10-2014-0029159 discloses a heat-radiating adhesive sheet of a foam type for use in smartphones and tablet PCs, in which the heat-radiating adhesive sheet includes a foaming layer, and adhesive layers that are formed on top and bottom surfaces of the foaming layer.

However, the heat-radiating adhesive sheet includes a foaming layer of a polyolefin-based, urethane-based, and acrylic-based material, and has a limit in radiating high-temperature heat locally generated from hotspot heat-generating components of mobile terminals. The adhesive layers also degrade heat-radiating efficiency and thus may not solve the problem of heat generation in recent high-performance mobile terminals.

DISCLOSURE

Technical Problem

The present invention has been made in view of the points as described above, and an object thereof is to provide a heat-radiating adhesive member that spreads heat generated from a heat-generating component of an electronic apparatus to prevent deterioration of the heat-generating component and to notably lower a temperature of the heat that is transferred to other components from the heat-generating component, a heat-radiating sheet using the heat-radiating adhesive member, and an electronic apparatus having the heat-radiating sheet.

Another object of the present invention is to provide a heat-radiating adhesive member that efficiently radiates heat generated from a heat-generating component of an electronic apparatus, to thus maintain temperatures of front and rear surfaces of the electronic apparatus to be at a predetermined temperature or less, a heat-radiating sheet using the heat-radiating adhesive member, and an electronic apparatus having the heat-radiating sheet.

Still another object of the present invention is to provide a heat-radiating adhesive member that can be implemented in a very small thickness so as not to increase thickness of an electronic apparatus while being capable of making excellent heat-radiating performance, a heat-radiating sheet using the heat-radiating adhesive member, and an electronic apparatus having the heat-radiating sheet.

Technical Solution

In order to achieve the above objects, according to an aspect of the present invention, there is provided a heat-radiating adhesive member comprising: an adhesive layer; first thermally conductive fillers that are dispersed inside the adhesive layer and spreads heat generated from a heat-generating component of an electronic apparatus in a horizontal direction of the adhesive layer; and second thermally conductive fillers that are dispersed inside the adhesive layer and transfer the heat generated from the heat-generating component of the electronic apparatus to the first thermally conductive fillers.

In addition, in order to achieve the above objects, according to another aspect of the present invention, there is provided a heat-radiating sheet comprising: a heat-radiating adhesive member including first thermally conductive fillers that spread heat generated from a heat-generating component of an electronic apparatus in a horizontal direction of the heat-radiating sheet, and second thermally conductive fillers that transfer the heat generated from the heat-generating component of the electronic apparatus to the first thermally conductive fillers; and a heat-radiating layer that is adhered onto the heat-radiating adhesive member, and spreads and radiates the heat generated from the heat-generating component of the electronic apparatus.

In addition, in order to achieve the above objects, according to still another aspect of the present invention, there is provided an electronic apparatus comprising: a bracket; a display panel mounted on the bracket; a flexible printed circuit board (FPCB) on which AP (Application Processor) IC and PM (Power Management) IC are mounted; a removable back cover; an inner cover for covering the bracket and the FPCB, in which the inner cover is positioned between the FPCB and the back cover; and a case provided with a universal subscriber identity module (USIM) chip and a micro memory that are provided in the inner cover, the electronic apparatus further comprising a heat-radiating sheet comprising: a heat-radiating adhesive member including first thermally conductive fillers that spread heat generated from a heat-generating component of an electronic apparatus in a horizontal direction of the heat-radiating sheet, and second thermally conductive fillers that transfer the heat generated from the heat-generating component of the electronic apparatus to the first thermally conductive fillers; and a heat-radiating layer that is adhered onto the heat-radiating adhesive member, and spreads and radiates the heat generated from the heat-generating component of the electronic apparatus, wherein the heat-radiating sheet is mounted on at least one of an area of the cushion layer opposite to the bracket, an area between the FPCB and the inner cover, an area of the case in which the USIM chip and the micro memory are mounted, and an area of the back cover, to thereby spread and radiate the heat generated from the heat-generating component.

Advantageous Effects

According to the present invention, heat generated from a heat-generating component of an electronic apparatus is spread to then be radiated, to thus prevent degradation of the heat-generating component and to thus lower temperature of heat transferred to other components from the heat-generating component.

The present invention has the advantage of lowering the temperature of heat transferred to the outside of an electronic apparatus from a heat-generating component of the electronic apparatus to thus maintain temperatures of front and back surfaces of the electronic apparatus to a predetermined temperature or less.

In the present invention, a heat-radiating adhesive member is implemented by using an adhesive layer in which first thermally conductive fillers that spread heat generated from a heat-generating component of an electronic apparatus in a horizontal direction of the adhesive layer, and second thermally conductive fillers that transfer the heat generated from the heat-generating component of the electronic apparatus to the first thermally conductive fillers, are dispersed, thereby facilitating the thermal diffusion in the horizontal direction to thus achieve an excellent heat-radiating ability.

In the present invention, excellent heat-radiating performance may be achieved without increasing the thickness of an electronic apparatus to accordingly produce a heat-radiating sheet having an ultra-thin thickness.

In the present invention, a heat-radiating sheet including a heat-radiating layer adhered onto an adhesive member having excellent heat-radiating performance is provided to help to prevent a user close to or in contact with an electronic apparatus from suffering a low-temperature burn.

BEST MODE

Hereinafter, embodiments of the present invention will be described in detail with reference to the accompanying drawings.

Figure 1:
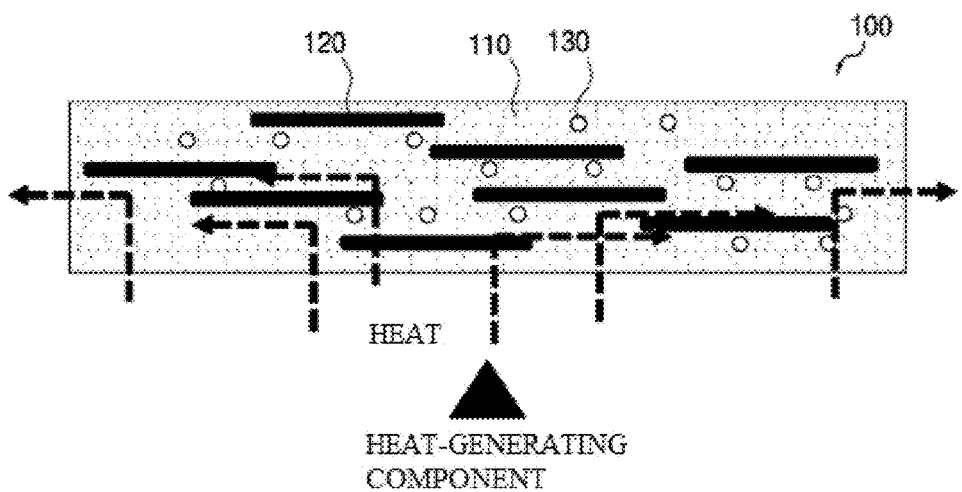
FIG. 1 is a cross-sectional view of a heat-radiating adhesive member according to an embodiment of the present invention.

Referring to FIG. 1, a heat-radiating adhesive member 100 in accordance with an embodiment of the present invention, includes: an adhesive layer 110; first thermally conductive fillers 120 that are dispersed inside the adhesive layer 110 and spread heat generated from a heat-generating component of an electronic apparatus in a horizontal direction of the adhesive layer 110; and second thermally conductive fillers 130 that are dispersed inside the adhesive layer 110 and transfer the heat generated from the heat-generating component of the electronic apparatus to the first thermally conductive fillers 120.

The heat-radiating adhesive member 100 according to the embodiment of this invention is attached to or close to a heat-generating component and thus spreads heat transferred from the heat-generating component in the horizontal direction in the first thermally conductive fillers 120, to thereby improve heat-radiating efficiency. Here, the second thermally conductive fillers 130 perform a function of transmitting the heat transferred from the heat-generating component to the first thermally conductive fillers 120, thereby promoting heat diffusion in the horizontal direction of the heat-radiating adhesive member 100 to thus improve a heat-radiating ability.

In other words, the first and second thermally conductive fillers 120 and 130 are present in a state of being dispersed in the adhesive layer 110, to thereby perform a function of promoting the heat of the heat-generating component to be spread in the horizontal direction, to thus lower the temperature of heat that is transferred in the vertical direction in the heat-radiating adhesive member 100.

The second thermally conductive fillers 130 may be positioned in regions of the adhesive layer 110 where the first thermally conductive fillers 120 are not present, to transfer heat of the heat-generating component to the first thermally conductive fillers 120 thereby changing a heat transfer path to proceed.

The first thermally conductive fillers 120 each may preferably have a plate-shaped structure (or in a rectangular structure) so as to spread heat in parallel to the heat-radiating adhesive member 100, and may be made of a material of at least one of GNF (Graphite Nano Fiber), CNT (Carbon Nano Fiber), metal fiber, AlN, and BN. The first thermally conductive fillers 120 each may be preferably implemented in a shape having an aspect ratio of 1:100.

The second thermally conductive fillers 130 each may have a spherical structure so as to transfer heat to the first thermally conductive fillers 120. In this case, the second thermally conductive fillers 130 receive heat transmitted from the heat-generating component and spread the heat onto a spherical surface, thereby changing a heat transfer path in the vertical direction of the heat-radiating adhesive member 100 to thus quickly transfer the heat to the first thermally conductive fillers 120. The second thermally conductive fillers 130 are preferably made of a material of at least one of MgO, $Al_2O_3$, SiC, and diamond.

Here, the first thermally conductive fillers 120 may be arranged on a plurality of layers having an interlayer spaced in the vertical direction of the adhesive layer 110, and the second thermally conductive fillers 130 may be positioned between layers of the first thermally conductive fillers 120.

Further, the first and second thermally conductive fillers 120 and 130 may be composed of a material having a thermal conductivity of 200~3000 W/mk.

The first and second thermally conductive fillers 120 and 130 preferably contain 5~15 wt % of the total weight of the adhesive layer 110. If the adhesive layer 110 contains the first and second thermally conductive fillers 120 and 130 of 5 wt % or less, a desired level of heat-radiating efficiency cannot be obtained, but if the adhesive layer 110 contains the first and second thermally conductive fillers 120 and 130 of 15 wt % or more, there is a disadvantage that adhesive performance is degraded.

The adhesive layer 110 is made of one of an acrylic-based, epoxy-based, aramid-based, urethane-based, polyamide-based, polyethylene-based, EVA-based, polyester-based, and PVC-based material. Then, the adhesive layer can also be implemented as a web state adhesive sheet having a plurality of pores or a hot melt type adhesive sheet having no pores, in which fibers that can be thermally adhered are accumulated.

Figure 2:
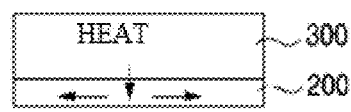
FIG. 2 is a partial schematic diagram of an electronic apparatus to which a heat-radiating sheet is attached according to an embodiment of the present invention.

Referring to FIG. 2, the heat-radiating sheet 200 according to an embodiment of the present invention is attached or close to a heat-generating component 300 of an electronic apparatus, to thus perform a function of heat-radiating by diffusing heat generated from the heat-generating component 300. Here, the heat-generating component 300 generates the locally high heat to thereby result in damage to the heat-generating component 300 by itself due to the high heat, and transfers the high heat to other components disposed around the heat-generating component 300 to thereby result in damage to the other components due to the high heat.

In particular, when the electronic apparatus is a mobile terminal, users hold the mobile terminal by hand, while wrapping the back cover of the mobile terminal by hand. Accordingly, the heat generated from the heat-generating component 300 is transmitted to the user's hand through the back cover to thereby cause a low-temperature burn or a discomfort in use.

Thus, the heat-radiating sheet 200 according to the embodiment of the present invention quickly spreads heat generated from the heat-generating component 300 and removes the locally high heat from occurring, to thereby prevent the heat-generating component 300 from being damaged by the locally high heat.

Then, the heat-radiating sheet according to the embodiments of the present invention to be described later may be mounted onto a mobile terminal that is a type of an electronic apparatus. Thus, if the heat-radiating sheet is mounted onto a mobile terminal, the heat-radiating sheet may perform a function of radiating heat generated from the mobile terminal. As a result, heat generated from a hot spot of the mobile terminal is dispersed, to thus minimize thermal effects applied to internal components of the mobile terminal, and reduce the heat temperature to be transmitted to the outside, to thereby minimize heat transferred to a user who grips the mobile terminal.

The electronic apparatuses that are described in the present invention represent any mobile small electronic apparatuses such as cellular phones, smart phones, laptop computers, notebook computers, digital broadcasting terminals, PDAs (Personal Digital Assistants), PMPs (Mobile Multimedia Players), navigators, and large electronic apparatuses such as TVs and refrigerators, including heat-generating components. Particularly, the heat-radiating sheet according to the embodiments of the present invention may be very usefully applied to a mobile terminal that emerges heating problems.

Figure 3:
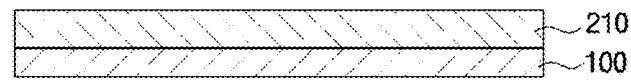
FIG. 3 is a cross-sectional view of a heat-radiating sheet with a heat-radiating adhesive member according to a first embodiment of the present invention.

Referring to FIG. 3, a heat-radiating sheet according to a first embodiment of the present invention, includes: a heat-radiating adhesive member 100 including first thermally conductive fillers that spread heat generated from a heat-generating component of an electronic apparatus in a horizontal direction of the heat-radiating sheet, and second thermally conductive fillers that transfer the heat generated from the heat-generating component of the electronic apparatus to the first thermally conductive fillers; and a heat-radiating layer 210 that is adhered onto the heat-radiating adhesive member 100, and spreads and radiates the heat generated from the heat-generating component of the electronic apparatus.

The heat-radiating sheet according to the first embodiment of the present invention or second and third embodiments to be described below is configured to include a heat-radiating adhesive member 100 that is adhered to a heat-generating component of an electronic apparatus or a component adjacent to the heat-generating component thereof, to thus perform a heat-radiating function.

Figure 4:
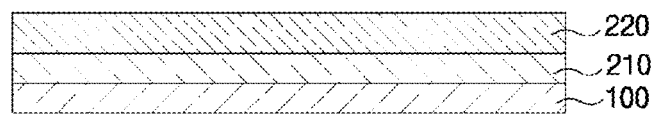
FIG. 4 is a cross-sectional view of a heat-radiating sheet according to a second embodiment of the present invention.

Referring to FIG. 4, a heat-radiating sheet according to a second embodiment of the present invention, includes: a heat-radiating adhesive member 100 including first thermally conductive fillers that spread heat generated from a heat-generating component of an electronic apparatus in a horizontal direction of the heat-radiating sheet, and second thermally conductive fillers that transfer the heat generated from the heat-generating component of the electronic apparatus to the first thermally conductive fillers; a heat-radiating layer 210 that is adhered onto the heat-radiating adhesive member 100, and spreads and radiates the heat generated from the heat-generating component of the electronic apparatus; and a color cover layer 220 that is stacked on the heat-radiating adhesive member 100, the color cover layer having diverse colors.

When the heat-radiating sheet according to the second embodiment will be adhered onto a portion that is exposed to the outside, the color cover layer having diverse colors enables the heat-radiating sheet to be beautifully designed and to match an ambient color, to thus maximize naturalness.

The color cover layer 220 may be formed by coating a chromatic color on a surface of the heat-radiating layer 210, in which a single-side adhesive tape on one side of which has a chromatic color may be used.

Figure 5:
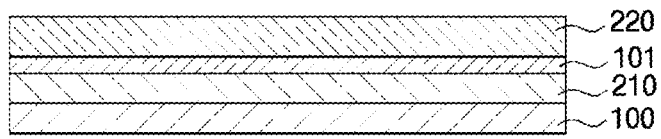
FIG. 5 is a cross-sectional view of a heat-radiating sheet according to a third embodiment of the present invention.

Referring to FIG. 5, a heat-radiating sheet according to a third embodiment of the present invention, may be implemented by inserting a heat-radiating adhesive member 101 including first and a second thermally conductive fillers between the heat-radiating layer 210 and the color cover layer 220, in the structure of the heat-radiating sheet according to the second embodiment.

That is, the heat-radiating sheet according to the third embodiment has a structure that heat-radiating adhesive members 100 and 101 are formed on both sides of the heat-radiating layer 210, and a color cover layer 220 is adhered onto one (for example, the heat-radiating adhesive member 101) of the heat-radiating adhesive members 100 and 101.

Figure 6:
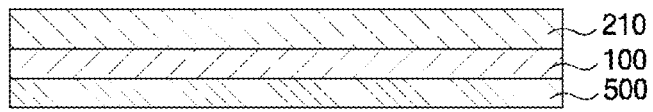
FIG. 6 is a cross-sectional view of a state where a heat-radiating adhesive member is tape-cast by using a tape casting method according to the present invention.

Referring to FIG. 6, the heat-radiating adhesive member 100 in accordance with an embodiment of the present invention may be cast on a tape base material 500 and thus may be implemented as a single-side tape structure. In this case, the heat-radiating layer 210 is adhered onto one surface of the heat-radiating adhesive member 100, and the tape base material 500 is adhered onto the other surface of the heat-radiating adhesive member 100.

The tape base material 500 is formed of a release member that can be easily removed when the heat-radiating sheet is adhered to a heat-generating component of an electronic apparatus or a component adjacent to the heat-generating component thereof, and functions as a protective film for protecting the heat-radiating adhesive member 100 before the heat-radiating sheet is attached to the heat-generating component.

Figure 7:
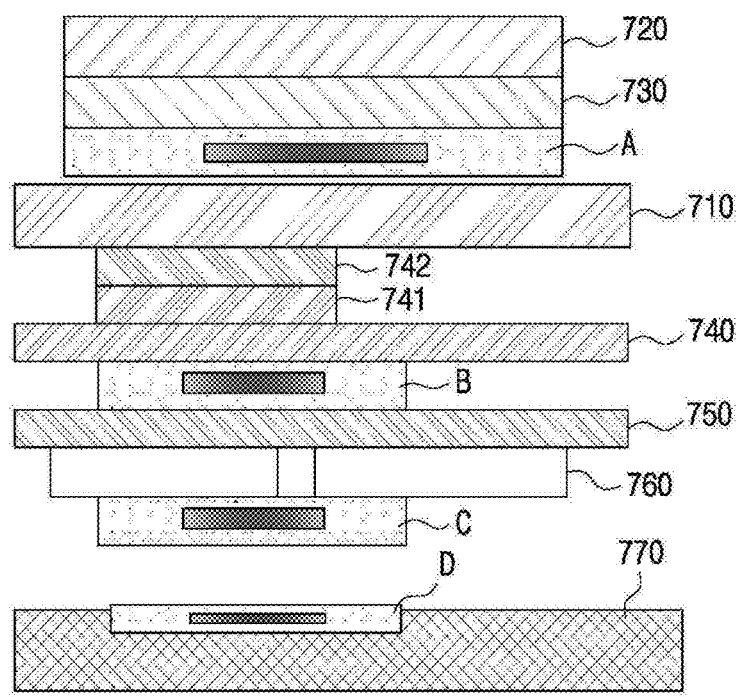
FIG. 7 is a schematic cross-sectional view explaining a position in a mobile terminal which is equipped with a heat-radiating sheet according to the present invention.

FIG. 7 is a schematic cross-sectional view explaining a position in a mobile terminal which is equipped with a heat-radiating sheet according to the present invention.

The heat-radiating sheet according to an embodiment of the present invention is attached to various regions of the mobile terminal, and spreads and radiates heat generated from the heat-generating component of the mobile terminal to thus lower temperature of heat transmitted to the outside.

Thus, the heat-radiating sheet is incorporated into the mobile terminal and thus functions as a means for preventing a low-temperature burn due to heat generated by the operation of the mobile terminal.

That is, as shown in FIG. 7, the mobile terminal includes: a bracket 710 on which various components are mounted for driving the mobile terminal; a display panel 720 mounted on the bracket 710; a cushion layer 730 positioned between the bracket 710 and the display panel 720; a flexible printed circuit board (FPCB) 740 on which AP (Application Processor) IC and PM (Power Management) IC 740 are mounted; a TIM (Thermal Interface Material) paste 742 that is interposed between the AP IC and PM IC 741 and the bracket 710 to thus enable heat transfer; a removable back cover 770; an inner cover 750 for covering the bracket 710 and the FPCB 740, in which the inner cover 750 is positioned between the FPCB 740 and the back cover 770; and a case 760 provided with a universal subscriber identity module (USIM) chip and a micro memory that are provided in the inner cover 750.

The display panel 720 is a panel to display an image screen such as an OLED panel or an LCD panel and is exposed to a front surface of the mobile terminal. Here, the back cover is mounted onto a rear surface of the mobile terminal.

In the mobile terminal having the above-described structure, the heat-radiating sheet is preferably mounted on at least one of an area "A" of the cushion layer 730 opposite to the bracket 710, an area "B" between the FPCB 740 and the inner cover 750, an area "C" of the case in which the USIM chip and the micro memory are mounted, and an area "D" of the back cover 770, to thereby spread and radiate the heat generated from the heat-generating component.

As described above, the present invention has been described with respect to particularly preferred embodiments. However, the present invention is not limited to the above embodiments, and it is possible for one who has an ordinary skill in the art to make various modifications and variations, without departing off the spirit of the present invention. Thus, the protective scope of the present invention is not defined within the detailed description thereof but is defined by the claims to be described later and the technical spirit of the present invention.

INDUSTRIAL APPLICABILITY

The present invention may be applied to a heat-radiating adhesive member that spreads heat generated from a heat-generating component of an electronic apparatus to prevent deterioration of the heat-generating component and to notably lower a temperature of the heat that is transferred to other components from the heat-generating component, a heat-radiating sheet using the heat-radiating adhesive member, and an electronic apparatus having the heat-radiating sheet.

The invention claimed is:

1. An electronic apparatus comprising:
   a bracket;
   a display panel mounted on the bracket;
   a flexible printed circuit board (FPCB) on which AP (Application Processor) IC and PM (Power Management) IC are mounted;
   a removable back cover;
   an inner cover for covering the bracket and the FPCB, in which the inner cover is positioned between the FPCB and the back cover;
   a case provided with a universal subscriber identity module (USIM) chip and a micro memory that are provided in the inner cover; and
   a heat-radiating sheet mounted on at least one of an area of a cushion layer opposite to the bracket, an area between the FPCB and the inner cover, an area of the case in which the USIM chip and the micro memory are mounted, and an area of the back cover, to thereby spread and radiate the heat generated from the heat-generating component,
   wherein the heat-radiating sheet comprising: a first heat-radiating adhesive member; and a heat-radiating layer that is adhered onto the heat-radiating adhesive member, and spreads and radiates the heat generated from the heat-generating component of the electronic apparatus, and
   wherein the first heat-radiating adhesive member comprising: an adhesive layer formed of a web state adhesive sheet having a plurality of pores, wherein the web state adhesive sheet is formed of thermally adhered and accumulated fibers; first thermally conductive fillers having a plate-shape and dispersed inside the adhesive layer in a horizontal direction thereof, wherein the first thermally conductive fillers are arranged in a plurality of layers spaced apart from each other, the horizontal direction being a direction perpendicular to a thickness of the adhesive layer; and second thermally conductive fillers having a spherical shape and dispersed inside the adhesive layer, wherein the second thermally conductive fillers are disposed between neighboring layers of the first thermally conductive fillers in such a way that heat generated from a heat-generating component of an electronic apparatus is transferred to the first thermally conductive fillers via the second thermally conductive filler and spread in the horizontal direction of the adhesive layer.

2. The electronic apparatus according to claim 1, wherein the first thermally conductive fillers are made of at least one of GNF (Graphite Nano Fiber), CNT (Carbon Nano Fiber), metal fiber, AlN, and BN.

3. The electronic apparatus according to claim 1, wherein the second thermally conductive fillers are made of at least one of MgO, $Al_2O_3$, SiC, and diamond.

4. The electronic apparatus according to claim 1, wherein the first thermally conductive fillers have the plate-shape having an aspect ratio of 1:100.

5. The electronic apparatus according to claim 1, wherein the first and second thermally conductive fillers are 5 wt % 15 wt % of the adhesive layer.

6. The electronic apparatus according to claim 1, wherein the web state adhesive sheet is made of one of an acrylic-based, epoxy-based, aramid-based, urethane-based, polyamide-based, polyethylene-based, EVA-based, polyester-based, and PVC-based material.

7. The electronic apparatus according to claim 1, wherein the heat-radiating sheet further comprises: a color cover layer having diverse colors, the color cover layer being laminated on the heat-radiating adhesive member.

8. The electronic apparatus according to claim 7, wherein the heat-radiating sheet further comprises: a second heat-radiating adhesive member that is interposed between the heat-radiating layer and the color cover layer.

9. The electronic apparatus according to claim 1, wherein the heat-radiating layer is adhered on one surface of the heat-radiating adhesive member, and further comprises: a tape base material on the other surface of the heat-radiating adhesive member.

* * * * *